US012105542B2

(12) United States Patent
Ahmadi et al.

(10) Patent No.: US 12,105,542 B2
(45) Date of Patent: ***Oct. 1, 2024

(54) DEVICE, SYSTEM, AND METHOD FOR TRACKING THE CONFIGURATION OR OPERATIONAL HISTORY OF A NOZZLE IN A FLUID JETTING SYSTEM

(71) Applicant: NORDSON CORPORATION, Westlake, OH (US)

(72) Inventors: Mani Ahmadi, Oceanside, CA (US); Daniel W. Ashley, Vista, CA (US); Erik Fiske, Carlsbad, CA (US)

(73) Assignee: Nordson Corporation, Westlake, OH (US)

(*) Notice: Subject to any disclaimer, the term of this patent is extended or adjusted under 35 U.S.C. 154(b) by 556 days.

This patent is subject to a terminal disclaimer.

(21) Appl. No.: 16/839,771

(22) Filed: Apr. 3, 2020

(65) Prior Publication Data

US 2020/0301454 A1 Sep. 24, 2020

Related U.S. Application Data

(63) Continuation of application No. 14/388,468, filed as application No. PCT/US2013/023536 on Jan. 29, 2013, now Pat. No. 10,642,286.

(Continued)

(51) Int. Cl.
*G05D 7/06* (2006.01)
*B05C 5/02* (2006.01)
(Continued)

(52) U.S. Cl.
CPC ......... *G05D 7/0635* (2013.01); *B05C 5/0216* (2013.01); *B05C 5/0225* (2013.01);
(Continued)

(58) Field of Classification Search
CPC . B05C 5/0216; B05C 5/0225; B05C 11/1034; H05K 3/0085; G05D 7/0635; H04B 5/0062

See application file for complete search history.

(56) References Cited

U.S. PATENT DOCUMENTS

| | | |
|---|---|---|
| 5,184,309 A | 2/1993 | Simpson et al. |
| 5,711,354 A | 1/1998 | Siegele et al. |

(Continued)

FOREIGN PATENT DOCUMENTS

| | | |
|---|---|---|
| DE | 3050226 C1 | 2/1985 |
| DE | 102006039839 A1 | 3/2008 |

(Continued)

OTHER PUBLICATIONS

EP16839771 translation (Year: 2007).*

(Continued)

*Primary Examiner* — Steven M Cernoch
(74) *Attorney, Agent, or Firm* — BakerHostetler

(57) ABSTRACT

Apparatus for use with an applicator, systems for dispensing fluids, methods of using a nozzle (52), and a nozzle (52). The nozzle (52) includes a communication device (60) having a memory (86). The memory (86) stores data relating to the operational history and configuration of the nozzle (52). In response to receiving a query signal (90) from an interrogation device (24), the communication device (60) transmits the data residing in the memory (86). The communication device (60) also receives and stores data in the query signal (90) to the memory (86) so that the operational history of the nozzle (52) is maintained in the memory (86) of the communication device (60). The transmitted data may be received by the interrogation device (24) and used to adjust a fluid dispensing operation, determine when the nozzle (52)

(Continued)

has reached the end of its operational life, for process improvement, or for inventory tracking.

20 Claims, 5 Drawing Sheets

Related U.S. Application Data

(60) Provisional application No. 61/636,485, filed on Apr. 20, 2012.

(51) Int. Cl.
  *B05C 11/10* (2006.01)
  *H05K 3/00* (2006.01)
  *H05K 3/12* (2006.01)

(52) U.S. Cl.
  CPC ........ *B05C 11/1034* (2013.01); *H05K 3/0085* (2013.01); *H05K 3/1241* (2013.01)

(56) References Cited

U.S. PATENT DOCUMENTS

| | | | |
|---|---|---|---|
| 5,923,572 A * | 7/1999 | Pollock | B67D 7/348 |
| | | | 700/282 |
| 6,382,269 B1 | 5/2002 | Tatsuno | |
| 6,460,404 B1 | 10/2002 | Chan et al. | |
| 6,732,770 B1 | 5/2004 | Nusbaumer et al. | |
| 7,114,510 B2 | 10/2006 | Peters et al. | |
| 7,172,096 B2 | 2/2007 | O'Dougherty | |
| 7,510,895 B2 | 3/2009 | Raterman | |
| 8,074,467 B2 | 12/2011 | Fiske et al. | |
| 8,137,745 B2 | 3/2012 | Pallante et al. | |
| 8,212,655 B2 | 7/2012 | Nelson et al. | |
| 8,214,103 B2 | 7/2012 | Kranz et al. | |
| 8,322,571 B2 | 12/2012 | Hovinen et al. | |
| 8,336,734 B2 | 12/2012 | Ware et al. | |
| 8,429,095 B1 | 4/2013 | Ryan | |
| 8,593,261 B2 | 11/2013 | Takagi et al. | |
| 8,905,152 B2 | 12/2014 | Kling et al. | |
| 9,027,788 B2 | 5/2015 | Ophardt et al. | |
| 9,073,028 B2 | 7/2015 | Hovinen et al. | |
| 9,079,758 B2 | 7/2015 | O'Dougherty et al. | |
| 9,109,934 B2 | 8/2015 | Ando et al. | |
| 9,120,616 B2 | 9/2015 | Ware et al. | |
| 9,174,834 B2 | 11/2015 | Veltrop et al. | |
| 10,642,286 B2 * | 5/2020 | Ahmadi | B05C 11/1034 |
| 2005/0087235 A1 * | 4/2005 | Skorpik | F16K 37/00 |
| | | | 137/554 |
| 2005/0087237 A1 | 4/2005 | O'Dougherty et al. | |
| 2005/0224523 A1 | 10/2005 | O'Dougherty et al. | |
| 2007/0069041 A1 | 3/2007 | Quinones et al. | |
| 2007/0146442 A1 | 6/2007 | Holm et al. | |
| 2007/0229229 A1 | 10/2007 | Nelson et al. | |
| 2008/0147232 A1 | 6/2008 | Kuribayashi et al. | |
| 2008/0251153 A1 * | 10/2008 | Bell | B67D 7/425 |
| | | | 222/39 |
| 2009/0099724 A1 | 4/2009 | Kranz et al. | |
| 2009/0179081 A1 * | 7/2009 | Charpie | B05B 12/124 |
| | | | 239/289 |
| 2009/0285983 A1 | 11/2009 | Baldauf et al. | |
| 2009/0314798 A1 | 12/2009 | Hovinen et al. | |
| 2010/0133292 A1 | 6/2010 | Ware et al. | |
| 2011/0181417 A1 | 7/2011 | Haskayne et al. | |
| 2013/0324148 A1 | 12/2013 | Geib et al. | |

FOREIGN PATENT DOCUMENTS

| | | | | |
|---|---|---|---|---|
| EP | 1165250 A1 | 1/2002 | | |
| EP | 1760642 A2 * | 3/2007 | ......... | F16K 37/0041 |
| JP | 2009-509748 A | 3/2009 | | |
| JP | 2012-069733 A | 4/2012 | | |
| WO | 00/62587 A1 | 10/2000 | | |

OTHER PUBLICATIONS

International Bureau of WIPO, International Preliminary Report on Patentability issued in International application No. PCT/US2013/023536 dated Oct. 21, 2014.
International Searching Authority, International Search Report issued in International application No. PCT/US2013/023536 dated Mar. 29, 2013.
Japanese Application No. 2015-506982: Notification of Reasons for Refusal dated Jan. 5, 2017, 4 pages.
Third Party Observation issued in International application No. PCT/US2013/023536 dated Dec. 18, 2013.
U.S. Appl. No. 13/219,064, filed Aug. 26, 2011, entitled Modular Jetting Devices.

* cited by examiner

DEVICE, SYSTEM, AND METHOD FOR TRACKING THE CONFIGURATION OR OPERATIONAL HISTORY OF A NOZZLE IN A FLUID JETTING SYSTEM

CROSS-REFERENCE TO RELATED APPLICATION

This application is a continuation of U.S. patent application Ser. No. 14/388,468, filed Sep. 26, 2014, which is a U.S. National Phase of International Patent Application No. PCT/US2013/023536, filed Jan. 29, 2013, which claims priority to U.S. Provisional Application No. 61/636,485, filed Apr. 20, 2012, the entire disclosures of each of which are hereby incorporated by reference as if set forth in their entirety herein.

TECHNICAL FIELD

The present invention generally relates to fluid material dispensing systems, and more particularly, to systems and methods for tracking the configuration or operational history of a nozzle used in a fluid jetting system.

BACKGROUND

Fluid dispensing systems, for dispensing liquid or viscous materials, have become an integral part of the electronics manufacturing process for depositing underfill, encapsulants, solder fluxes, surface mount adhesives, conformal coatings, and other viscous materials onto a substrate, such as a printed circuit board. One type of fluid dispensing system operates by forcing a measured quantity of the fluid to be deposited through an aperture, or nozzle, to generate one or more droplets of the fluid that release from the nozzle without wetting the substrate and are deposited on the substrate. Fluid dispensing systems of this type, which are commonly known as jetting dispensers, typically include a replaceable nozzle that is coupled to a fluid applicator. The applicator includes a fluid chamber and a valve that work cooperatively to provide the forced quantity of fluid to the nozzle. To allow fluid to be dispensed in selected locations on the substrate, the applicator is typically coupled to a fluid dispensing machine by an X-Y positioner, although systems may also use mechanisms that move the substrate relative to the applicator. A system controller is coupled to the X-Y positioner and applicator valve, and provides a means of controlling the deposition of fluids on the substrate by selectively activating the X-Y positioner and the valve.

Typically, the valve includes an elongated member, or needle, with a tip configured to selectively engage a valve seat. During a jetting operation, the needle is moved relative to the valve seat by a driving mechanism. Contact between the tip of the needle and the valve seat seals off a discharge passage in the valve seat from the fluid chamber, which is supplied with fluid material under pressure. To dispense droplets of the fluid material, the needle is retracted from contact with the valve seat to allow a finite amount of the fluid material to flow through the newly formed gap and into the discharge passage. The tip of the needle is then moved rapidly toward the valve seat to close the gap, which generates pressure that accelerates the finite amount of fluid material through the discharge passage and causes a droplet of the material to be ejected, or jetted, from an outlet of the discharge passage.

The fluid dispensing machine is configured to provide controlled movements of the applicator above the substrate as the fluid material is jetted to land on an intended application area of the substrate. By rapidly jetting the material "on the fly" (i.e., while the jetting device is in motion), the dispensed droplets may be joined to form a continuous line or other pattern. Fluid dispensing machines with applicators may therefore be easily programmed to dispense a desired pattern of droplets of fluid material. This versatility has made jetting fluid dispensing systems suitable for a wide variety of applications in the electronics industry. For example, underfill material can be applied using a jetting dispenser to dispense fluid material proximate to one or more edges of the chip, with the material then flowing under the chip by capillary action. To allow the applicator to be adapted to different fluid dispensing operations, the nozzle is typically detachable from the applicator so that a nozzle can be selected and utilized which has the dispensing characteristics necessary for the desired dispensing operation or fluid type.

During a normal production run, the valve seat may be subjected to several million operation cycles. Over time, repeated contact between the valve needle and valve seat will cause valve seat to wear, altering the dimensions of the discharge passage. These changes in the discharge passage dimensions tend to alter the dispensing characteristics of the nozzle. In addition, the fluid may erode the nozzle discharge passage, further altering the shape, size, and uniformity of the droplets deposited by the applicator. These changes in the dispensing characteristics of the nozzle depend not only on the number of operation cycles, but also on the materials used to construct the valve seat, and the types of fluids being dispensed. For example, depositing fluids that have abrasive characteristics will typically cause the nozzle to wear out more quickly than depositing non-abrasive fluids. Likewise, a nozzle with a ceramic valve seat will typically have a different life expectancy than a nozzle with a metal valve seat. Thus, to maintain the desired fluid dispensing characteristics of the dispensing system, the nozzle must occasionally be replaced, with the required replacement time depending on the operational history of the nozzle.

Determining the operational history of a jetting dispenser may be difficult, however, because the nozzle may have been moved between different fluid dispensing machines over its lifetime, as well as used to dispense various fluids. Nozzles may therefore be replaced prematurely, or left in service too long, because system operators have lost track of the operational history of the nozzle. Nozzles that have been used to dispense one type of fluid may also be inadvertently attached to a fluid dispensing machine used to deposit a different, incompatible type of fluid. These errors may result in unnecessary expenses from replacing nozzles that have not yet worn out and from substrates that must be discarded or recycled due to improper fluid deposition.

Thus, there is a need for improved devices, systems, and methods of tracking the configuration or operational history of nozzles, such as jetting dispenser nozzles, and for determining when nozzles have reached the end of their operational lifetimes.

SUMMARY

In one embodiment, an apparatus is provided for use with an applicator. The apparatus includes a nozzle configured to be removably coupled to the applicator and to receive amounts of fluid therefrom, and having an outlet through which the amounts of fluid are discharged. The apparatus further includes a communication device coupled to the nozzle that includes a memory and that is configured to transmit a response signal containing data residing in the memory in response to receiving a query signal.

In another embodiment, a system is provided for use with a nozzle configured to receive and dispense amounts of fluid through an outlet, and that has a communication device with a memory and that is configured to transmit a response signal containing data residing in the memory in response to receiving a query signal. The system includes an applicator configured to removably receive the nozzle, and an interrogation device configured to transmit the query signal to the communication device of the nozzle.

In another embodiment, a method of using a nozzle is provided. The method includes receiving a query signal in a communication device coupled to the nozzle, and in response to receiving the query signal, transmitting a response signal containing data residing in a memory of the communication device.

In another embodiment, a nozzle for use with an applicator for fluid or viscous materials is provided. The nozzle includes an inlet through which the fluid or viscous material is received and an outlet through which amounts of the fluid or viscous material are discharged. The nozzle further includes a communication device coupled to the nozzle that includes a memory. The communication device is configured to transmit a response signal containing data residing in the memory in response to receiving a query signal.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Embodiments of the invention are directed to a nozzle that includes a communication device configured to receive and transmit data relating to the nozzle, such as operational history data or configuration data, as well as systems and methods of communicating with the communication device. To this end, the communication device includes a memory that allows the nozzle to maintain a record of the operational history of the nozzle and as well as store data relating to the nozzle configuration. The communication device communicates with other fluid dispensing system components, such as a fluid dispensing machine or inventory management system, which may exchange data relating to the operational history of the nozzle with the communication device. The operational history data may include one or more parameters relating to a previous operation of the nozzle, and may be stored in the memory to maintain an accessible and accurate record of the operational history of the nozzle. The operational history parameters may include, but are not limited to: a cumulative number of operation cycles the nozzle has experienced (i.e., a number of times that the valve has opened and closed), an identity of a fluid dispensing machine or applicator to which the nozzle has been coupled, or a type of fluid or viscous material that has been dispensed by the nozzle. The memory may also store data that includes parameters relating to the configuration of the nozzle. These nozzle configuration parameters may include a size of an opening in a valve seat of the nozzle, a type of material of which a valve seat of the nozzle is comprised, or a nozzle identifier, e.g., a nozzle serial or model number. In an embodiment of the invention, the communication device may be a radio frequency identification (RFID) tag that communicates wirelessly with the other fluid dispensing system components via one or more RFID tag readers.

Figure 1:
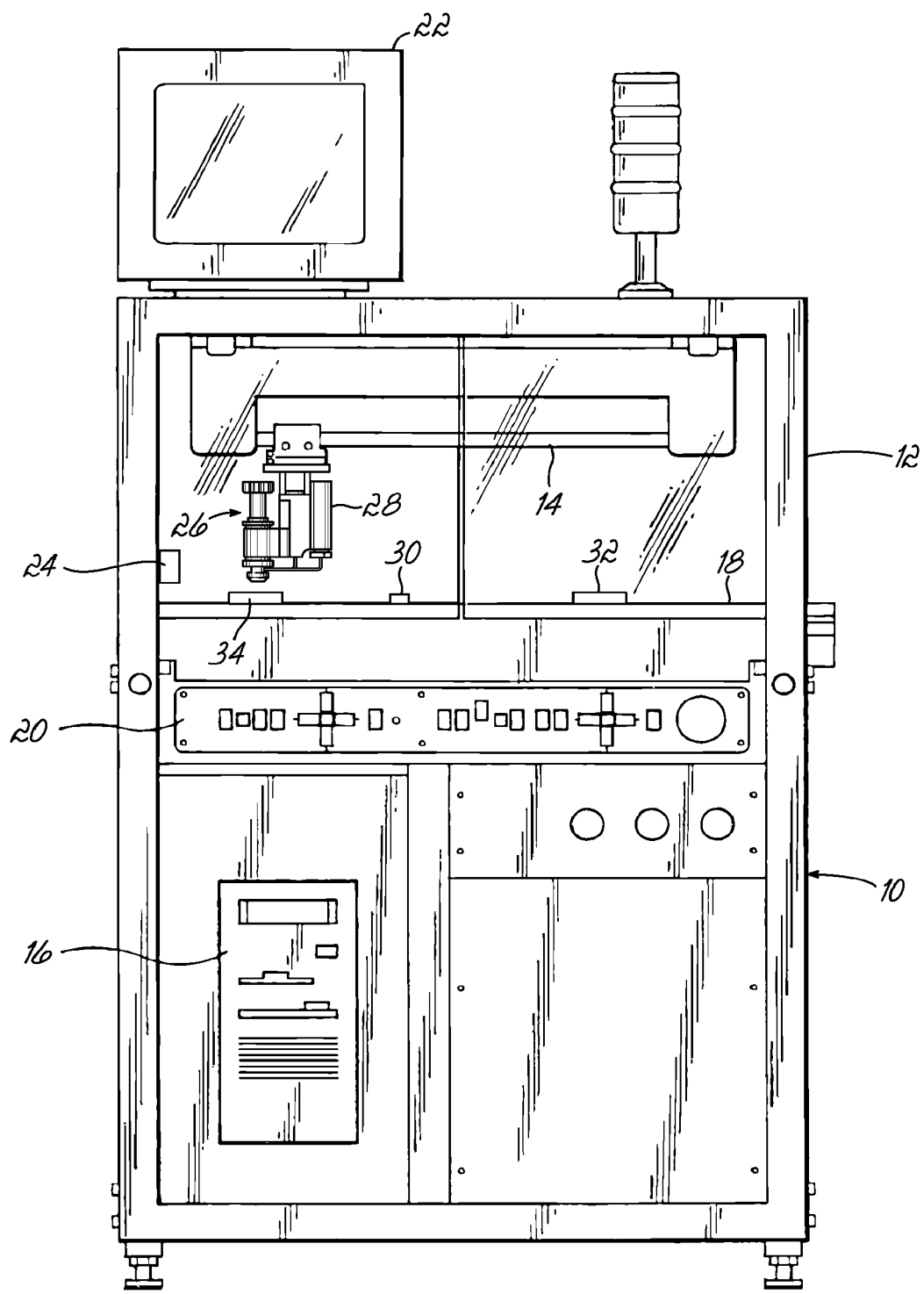
FIG. 1 is a diagrammatic illustration of a fluid dispensing machine including an applicator, a nozzle, and a system controller.

Referring now to the figures, FIG. 1 illustrates an exemplary fluid dispensing machine 10 of a type that is commercially available from the Asymptotic Technologies, Inc, doing business as Nordson Asymtek, of Carlsbad, California. The fluid dispensing machine 10 includes a rectangular frame 12 made of interconnected horizontal and vertical steel beams. The rectangular frame 12 provides support for the main components of the fluid dispensing machine 10, which include an X-Y positioner 14, a system controller 16, a working surface 18, a control panel 20, a system display 22 and an interrogation device 24. An applicator 26 may be operatively coupled to the X-Y positioner 14, and includes a fluid source 28, such as a syringe, that supplies the fluid to be dispensed by the machine 10. The applicator 26 may be coupled to the X-Y positioner 14 by a Z-axis drive (not shown) to move the applicator 26 vertically up and down, so that the applicator 26 can be selectively positioned in three axes relative to the working surface 18 by the system controller 16. The working surface 18 may also be part of a conveyer system (not shown) that delivers substrates, such as PC boards, to the fluid dispensing machine 10. The working surface 18 may also include one or more service stations, such as a priming station 30, a calibration station 32, and a communication station 34.

Figure 2:
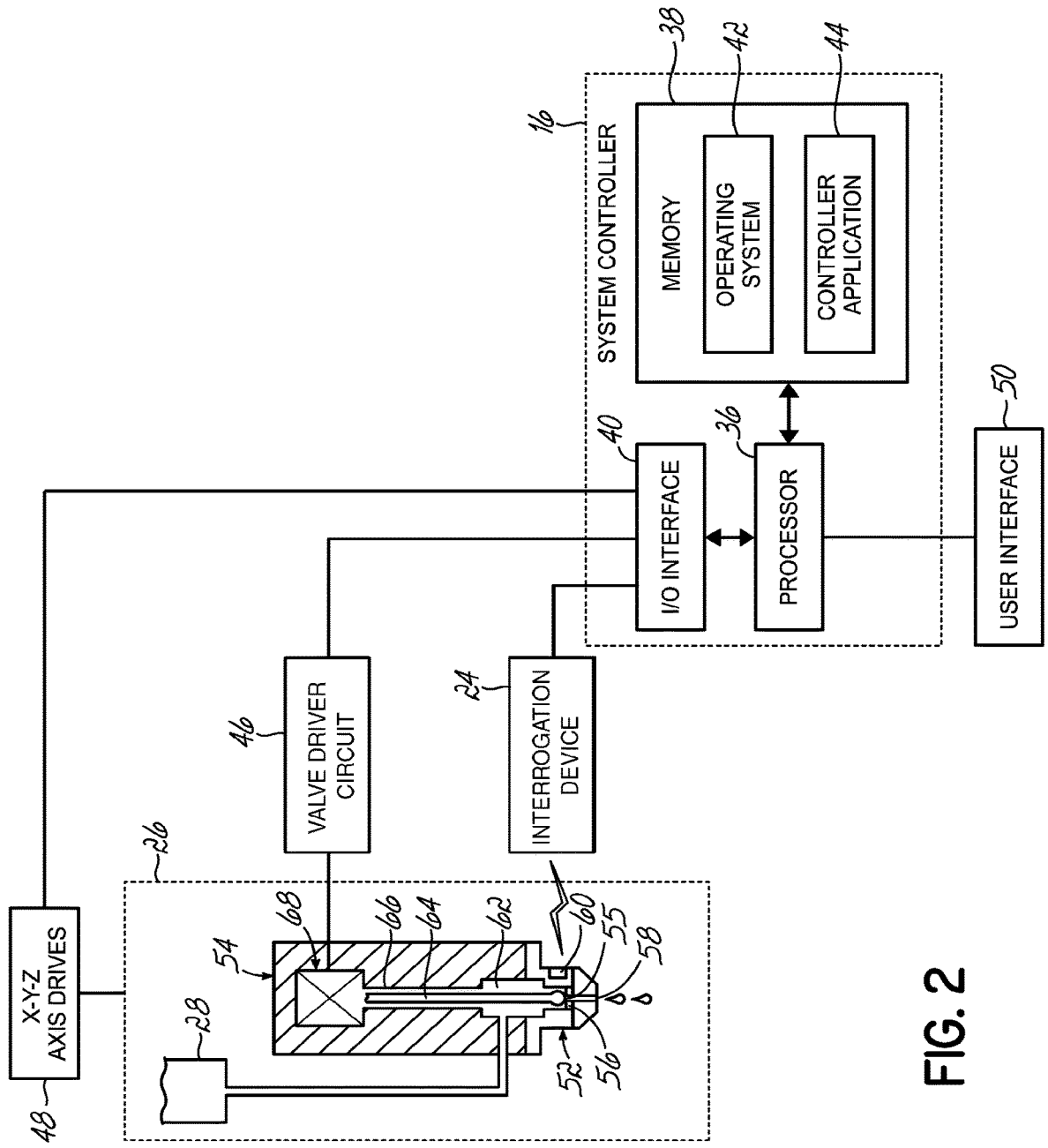
FIG. 2 is a schematic block diagram illustrating the system controller, applicator, and nozzle of FIG. 1 with a communication device and an interrogation device.

Referring now to FIG. 2, the system controller 16 includes a processor 36, a memory 38, and an input/output (I/O) interface 40. The processor 36 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 38. Memory 38 may be a single memory device or a plurality of memory devices including but not limited to read-only memory (ROM), random access memory (RAM), volatile memory, non-volatile memory, static random access memory (SRAM), dynamic random access memory (DRAM), flash memory, cache memory, or any other device capable of storing digital information. Memory 38 may also include a mass storage device (not shown) such as a hard drive, optical drive, tape drive, non-volatile solid state device or any other device capable of storing digital information.

Processor 36 may operate under the control of an operating system 42 that resides in memory 38. The operating system 42 may manage the system controller resources so that computer program code embodied as one or more computer software applications, such as a controller application 44, residing in memory 38 may have instructions executed by the processor 36. In an alternative embodiment, the processor 36 may execute the applications directly, in which case the operating system 42 may be omitted. The I/O interface 40 operatively couples the processor 36 to the interrogation device 24, a valve driver circuit 46, and the X, Y and Z drives 48. The I/O interface 40 may also employ one or more suitable communication protocols for communicating with other external devices or networks, such as a TCP/IP protocol over a IEEE 802.3 (Ethernet) or 802.11 (Wi-Fi) connection, or one or more RS-232 and SMEMA CIM communications busses that are compatible with most types of automated equipment utilized in substrate production assembly lines.

A user interface 50 may be operatively coupled to the processor 36 of system controller 16 in a known manner to allow a system operator to interact with the system controller 16. To this end, the user interface 50 may include the system display 22, as well as other output devices, such as alphanumeric displays, a touch screen, a speaker, and other audio and visual indicators. The user interface 50 may also include the control panel 20, as well as other input devices and controls such as an alphanumeric keyboard, a pointing device, keypads, pushbuttons, control knobs, microphones, etc., capable of accepting commands or input from the operator and transmitting the entered input to the processor 36.

The system controller 16 is configured to move the applicator 26 in a controlled manner via selective activation of the X-Y-Z axes drives 48, thereby rapidly moving the applicator 26 over the working surface 18. To this end, the X-Y-Z axes drives 48 may include the electro-mechanical components of the X-Y positioner 14 and a Z-axis drive mechanism to provide X, Y and Z axes of motion, respectively.

The applicator 26 may be implemented using different designs, and persons having ordinary skill in the art will understand that embodiments of the invention are not limited to the particular applicator configuration described herein. U.S. Pat. No. 8,074,467, the disclosure of which is hereby incorporated by reference in its entirety, shows an example of an applicator that could be used with this invention. The exemplary applicator 26 illustrated in FIG. 2 includes a nozzle 52 removeably coupled to an applicator body 54. The nozzle 52 includes a fluid inlet 55, a valve seat 56 having an opening defining a fluid discharge passage 58, and a communication device 60. The applicator body 54 includes a fluid chamber 62 fluidically coupled to the fluid source 28, and a valve member 64 in the form of a pin or needle that moves reciprocally in a channel 66 in response to urging by a valve driver or actuation mechanism 68. The actuation mechanism 68 may comprise an electro-mechanical device, such as a piezoelectric drive module or a solenoid. The actuation mechanism 68 may also be an electro-pneumatic device, such as a pneumatic piston coupled to one or more pneumatic solenoids or other suitable device that provides a controlled source of a pressurized fluid. In any case, persons having ordinary skill in the art will understand that any suitable device may be used for the actuation mechanism 68, and that embodiments of the invention are not limited to a particular type of device. The nozzle 52 may be one of the modular nozzles shown and described in U.S. patent application Ser. No. 13/219,064, filed Aug. 26, 2011 and titled "Modular Jetting Devices, the disclosure of which is hereby incorporated by reference herein in its entirety.

A fluid dispensing operation or operation cycle may be initiated by the system controller 16 providing an output pulse signal to the valve driver circuit 46, which is configured to provide a signal suitable for activating the actuation mechanism 68. By way of example, in the case of a pneumatic actuation mechanism, motion may be imparted to the valve member 64 by a piston (not shown) located in an air cylinder (not shown) and coupled to the valve member 64. To operate the valve, the valve driver circuit 46 may port a pulse of pressurized air into the air cylinder in response to the output pulse from the controller 16. This air pulse may produce a rapid lifting of the piston, which in turn provides upward motion to the valve member 64. This upward motion of the valve member 64 may allow fluid from the fluid chamber 62 to flow into a space between the discharge passage 58 and the valve member 64. When the output pulse signal ceases, the pressurized air is released from the air cylinder. In response, a return spring (not shown) may rapidly push the valve member 64 back into contact with the valve seat 56. The rapid motion of the valve member 64 into contact with the valve seat 56 may cause the fluid in the discharge passage 58 or between the valve member 64 and discharge passage 58 to be rapidly extruded or jetted through the discharge passage 58. Rapid successive cycling (i.e. opening and closing) of the valve member 64 as the applicator 26 is moved about by the X-Y positioner 14 under control of the system controller 16, selectively deposits droplets of fluid at selected locations of a substrate placed on the working surface 18.

Figure 3A:
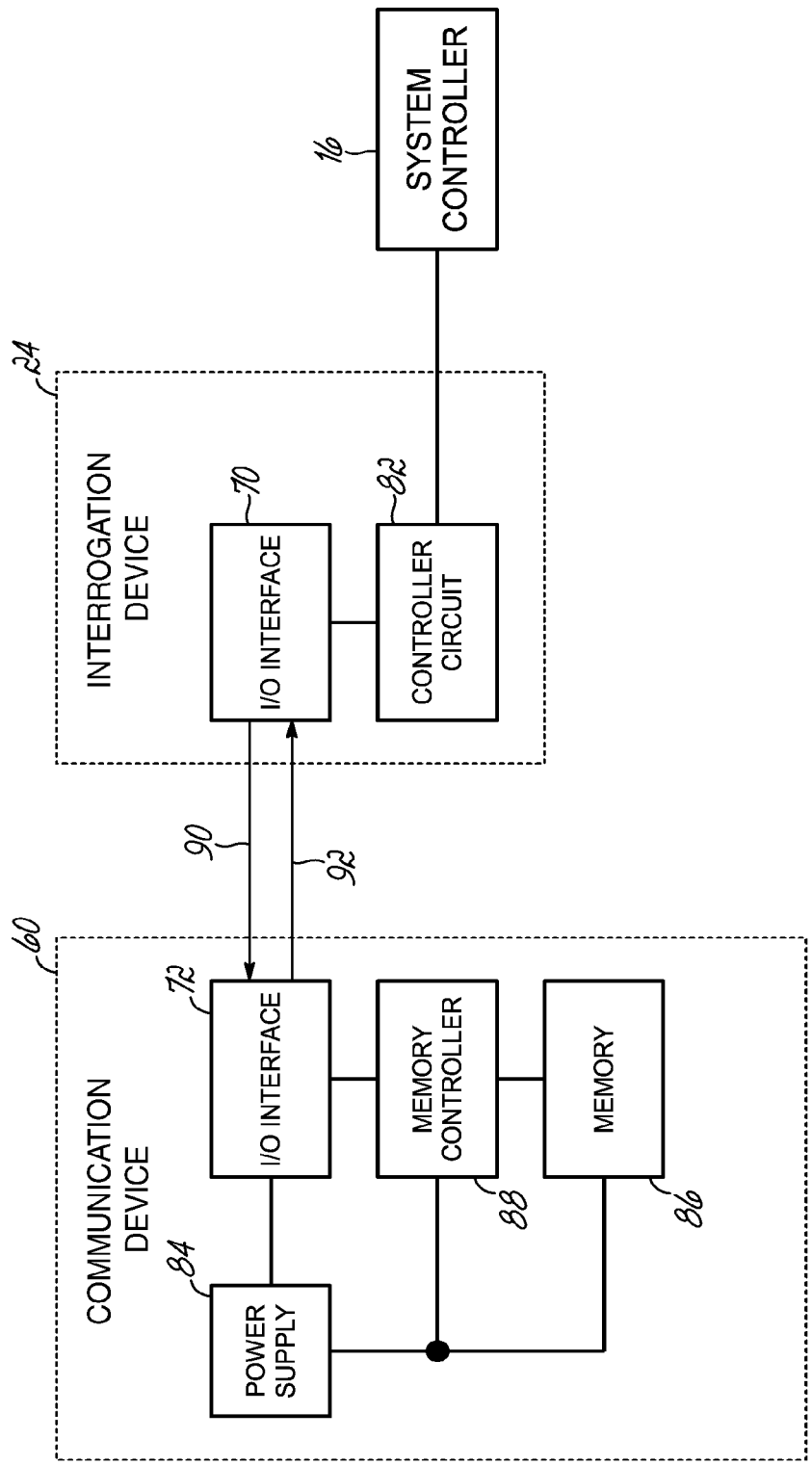
FIG. 3A is a schematic block diagram of the communication device and the interrogation device of FIG. 2.
Figure 3B:
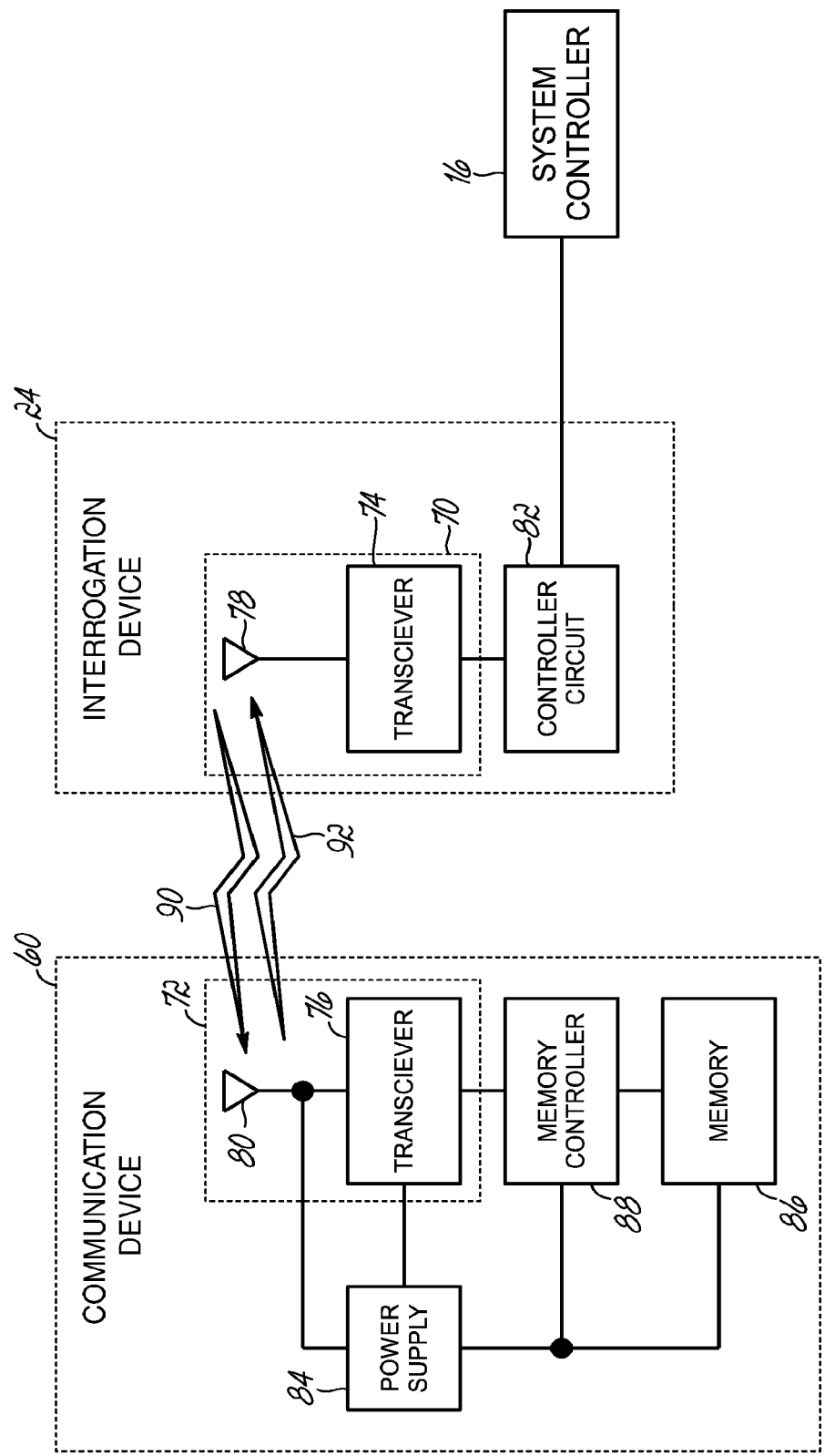
FIG. 3B is a schematic block diagram of the communication device and the interrogation device of FIG. 2 for an alternative embodiment of the invention.

Referring now to FIGS. 3A and 3B, the interrogation device 24 and communication device 60 each include an I/O interface 70, 72. The device I/O interfaces 70, 72 may be comprised of connection interfaces that are electrically, magnetically, or electromagnetically coupled when the applicator 26 is positioned in the communication station 34. To this end, the communication station 34 and nozzle 52 may be configured so that the interrogation device 24 and communication device 60 are in close proximity, such as within 20 mm, when the applicator 26 is located in the communication station 34. The I/O interfaces 70, 72 shown in FIG. 3A may thereby be conductively coupled (e.g., in physical contact), capacitively coupled, or inductively coupled by positioning the applicator 26 in the communication station 34. In an alternative embodiment of the invention illustrated in FIG. 3B, the I/O interfaces 70, 72 may be comprised of transceivers 74, 76 coupled to antennas 78, 80, respectively, which may be in the form of a coil or conductive patch. In this alternative embodiment, the devices 24, 60 may exchange data via radio frequency signals. Devices of this type are commonly referred to as RFID tags (in the case of the communication device 60) or RFID tag readers (in the case of the interrogation device 24). In an alternative embodiment of the invention in which the devices 24, 60 use radio frequency signals having sufficient strength, the devices 24, 60 may exchange data while the applicator 26 is not located in the communication station 34. The interrogation device 24 may include a controller circuit 82 configured to process signals from the controller 16 into a form suitable for transmission via the I/O interface 70, and to likewise process signals received from the I/O interface 70 into a form suitable for transmission to the system controller 16.

The communication device 60 may include a power supply 84, a memory 86, and a memory controller 88. The power supply 84 may be a circuit coupled to the I/O interface 72, and is configured to provide power to the circuits in the communication device 60, including the transceiver 76 (if present), the memory 86, and the memory controller 88. In an embodiment of the invention, the power supply 84 obtains power from a query signal 90 that is transmitted to the communication device 60 from the interrogation device 24. The power supply 84 may rely exclusively on the power obtained from the query signal 90 to power the communication device 60, or the power supply 84 may include an internal source of power, such as a battery or capacitor (not shown). This internal power source, if present, may be used to augment power obtained from the query signal 90, or may be used to power the communication device 60 independently of any external sources of power.

The query signal 90 may contain data that is decoded or processed by the transceiver 76 or memory controller 88 and stored in memory 86. The data stored in the memory 86 may include data relating to a previous operation of the nozzle 52, and may be updated in response to receiving the query signal 90. To this end, the data updated in the memory 86 may include data relating to a cumulative number of operation cycles to which the nozzle 52 has been subjected, an identity of a fluid dispensing machine 10 or applicator 26 to which the nozzle has been removably coupled, or a type of fluid that has been dispensed by the nozzle 52. The data may be stored in memory using any suitable protocol, such as a first in-first out (FIFO) memory location selection method. The data may also be written to predetermined regions of the memory 86 based on the content or type of data being stored. For example, data having a header indicating that the data is user specific or user defined data may be written to a region in the memory 86 reserved for a user definable field. Similarly, data relating to a particular event or parameter, e.g., a previous or cumulative number of operation cycles to which the nozzle 52 has been subjected, may be written to a specific location in memory 86 reserved for that data.

Similarly, the data in the query signal 90 may include operational history parameters relating to dispensing operations performed by the nozzle 52. For example, the query signal data may relate to a number of operation cycles to which the nozzle 52 has been subjected during one or more fluid dispensing operations. The one or more dispensing operations may include all the operation cycles since the nozzle 52 was first coupled to the fluid dispensing machine 10, since a previous query signal 90 was sent to the communication device 60, or that were performed in a particular dispensing operation. The data may also relate to a cumulative number of operation cycles representing a sum of: (1) a previous number of times the nozzle 52 or the valve seat 56 has experience an operation cycle, which may have been obtained from memory 86 by the system controller 16 at a time the nozzle 52 was coupled to the dispensing machine 10 or in response to entering a production mode; and (2) an additional number of operation cycles representing the number of operation cycles experienced by the nozzle 52 or valve seat 56 since the previous number of operation cycles was obtained from memory 86. Data representing the cumulative number of operation cycles to which the nozzle 52 has been subjected over the lifetime of the nozzle 52 may thereby be maintained in the memory 86 as the nozzle 52 is moved between multiple fluid dispensing machines 10. The data contained in the query signal 90 may also include data relating to one or more types of fluid that have been dispensed by the nozzle 52, a serial number or other identifier of the fluid dispensing machine 10 or applicator 26, or any other data relating to the operational history of the nozzle 52.

In response to receiving the query signal 90, the communication device 60 may transmit a response signal 92. The response signal 92 may contain data read from the memory 86, which may include data read from both read-only and writable regions of the memory 86. Data transmitted in the response signal 92 may include nozzle configuration data such as, but not limited to: a size of an opening in the valve seat 56, a type of material comprising the valve seat 56, or an identifier of the nozzle 52, such as a serial or model number. The data in the response signal 92 may also include data regarding the operational history of the nozzle 52, such as but not limited to: a cumulative number of operation cycles to which the valve seat 56 has been subjected, an identifier of a fluid dispensing machine 10 or applicator 26 to which the nozzle 52 has been coupled, or a type of fluid that has been dispensed by the nozzle 52.

Figure 4:
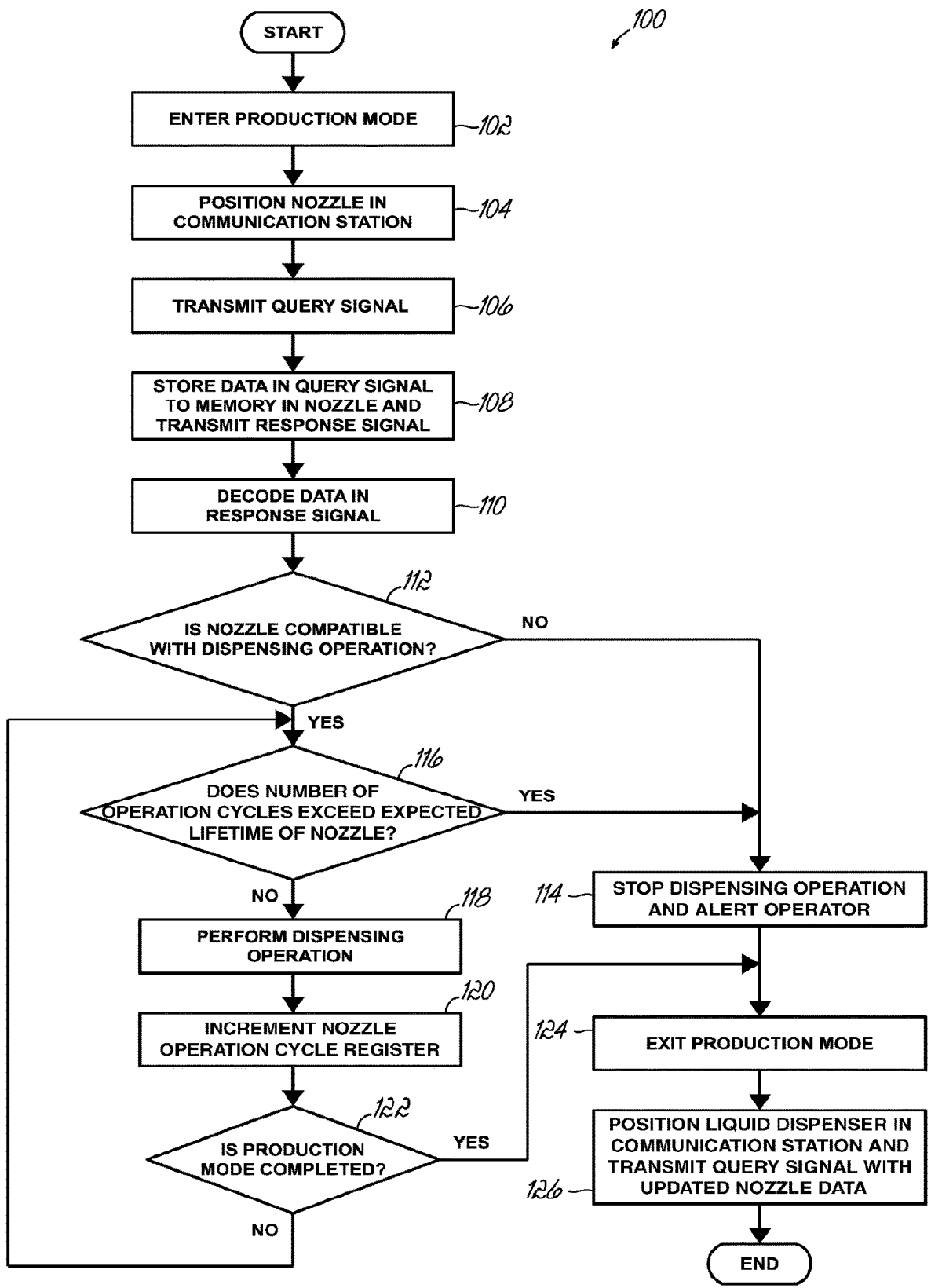
FIG. 4 is a flowchart illustrating an operation of the fluid dispensing machine in FIG. 1

Referring to FIG. 4, flow chart 100 illustrates execution of an exemplary production mode program by the system controller 16 that causes the fluid dispensing machine 10 to deposit fluids on a substrate in a desired manner or pattern. In block 102, the fluid dispensing machine 10 enters a production mode. The production mode may be entered in response to the system operator initiating execution a fluid dispensing program, such as controller application 44, residing in the system controller memory 38. The production mode may be entered subsequently or in response to coupling a nozzle 52 to the applicator 26, or may be entered using a nozzle 52 already coupled to the applicator 26. In response to entering the production mode, the system controller 16 may proceed to block 104. In block 104, the system controller 16 may position the applicator 26 in the communication station 34 via selective activation of the X-Y-Z drives. In response to the applicator 26 being positioned in the communication station 34, the system controller 16 may proceed to block 106.

In block 106, the system controller 16 may transmit the query signal 90 via the interrogation device 24. As previously discussed with respect to FIGS. 3A and 3B, the query signal 90 may provide power that activates the communication device 60, and may contain data relating to the fluid to be dispensed by the fluid dispensing machine 10, an identifier of the fluid dispensing machine 10 or applicator 26, instructions on what data to include in the response signal 92, or any other suitable data regarding the operation of the fluid dispensing machine 10 or nozzle 52. In an alternative embodiment of the invention, the system controller 16 may transmit the query signal 90 in response to entering the production mode without first positioning the applicator 26 in the communication station 34. This alternative embodiment may be used if, for example, the interrogation device 24 is an RFID tag reader that transmits a query signal 90 having sufficient power to activate the communication device 60 without the communication device 60 being in close proximity to the interrogation device 24.

In block 108, and in response to receiving the query signal 90, the communication device 60 may decode the data in the query signal 90, optionally store the data in memory 86, and transmit a response signal 92. The response signal 92 may contain data residing in memory 86, such as the size of the opening in the valve seat 56, the type of material comprising the valve seat 56, an identifier of the nozzle 52 such as a serial or model number, one or more types of fluids that have been dispensed by the nozzle 52, the previous or cumulative number of operation cycles to which the nozzle 52 or valve seat 56 has been subjected, a user defined parameter, or any other data regarding the configuration or operational history of the nozzle 52.

In block 110, the interrogation device 24 receives and decodes the data in the response signal 92. This data may be provided to the system controller 16 and used to adjust the operation of the fluid dispensing machine 10. For example, the number of operation cycles to which the nozzle 52 has been subjected may be stored in a nozzle operation cycle register residing in the system controller memory 38. This register may be used by the system controller 16 in determining when the nozzle 52 has reached the end of the nozzle's service life.

In block 112, the system controller 16 determines if the nozzle 52 is compatible with the dispensing operations required by the production mode based on the data received in the response signal 92. This compatibility determination may be based on a number of compatibility checks, such as, but not limited to: (1) checking the compatibility between the fluids previously dispensed by the nozzle 52 and the fluid to be dispensed while in the current production mode; and (2) checking the compatibility between the configuration of the nozzle 52 and the requirements of the current production mode. If the system controller 16 determines that the nozzle 52 is not compatible with the requirements of the current production mode ("NO" branch of decision block 112), the system controller 16 may reject the nozzle 52 by proceeding to block 114. In block 114, the system controller 16 stops the dispensing operation and alerts the system operator. This alert may be, for example, in the form of an error message presented on the system display 22 that informs the system operator of the nature of the problem. In an alternative embodiment of the invention, the system controller 16 may also determine if the nozzle 52 will last long enough to complete the production mode as part of the compatibility determination. This determination may be based on the previous number of operation cycles to which the nozzle 52 has been subjected and the expected number of operation cycles required by the production mode. If the nozzle 52 is not expected to last for the duration of the production mode, the system controller 16 may stop the dispensing operation and alert the operator by proceeding to block 114 as described above.

If the system controller 16 determines that the nozzle 52 is compatible with the requirements of the current production mode ("YES" branch of decision block 112), the system controller 16 may proceed to block 116. In block 116, the system controller 16 compares the cumulative number of times the nozzle 52 has been subjected to an operation cycle to a maximum number of operation cycles allowed by the production mode, i.e., a lifetime number of cycles. The lifetime number of cycles may depend on the type of valve seat 56 in the nozzle 52 (e.g., the valve seat material), the types of fluids that have been dispensed by the nozzle 52 (e.g., abrasive fluids or non-abrasive fluids), as well as the tolerance of the current production mode to variations in dot size produced by the nozzle 52. For example, a nozzle 52 used to dispense abrasive fluids might be considered worn out after 20 million operation cycles, while a nozzle 52 used to dispense non-abrasive fluids might not be considered worn out until after 100 million operation cycles. In response to a determination that the cumulative number of times the nozzle 52 has been subjected to an operation cycle exceeds the lifetime number of cycles allowed by the production mode and nozzle history ("YES" branch of decision block 116), the system controller 16 may proceed to block 114, thereby stopping the dispensing operation and issuing an alert as previously described.

In response to a determination that the cumulative number of times the nozzle 52 has been subjected to an operation cycle does not exceed the lifetime number of cycles allowed by the production mode ("NO" branch of decision block 116), the system controller 16 may proceed to block 118. In block 118, the system controller 16 may cause the fluid dispensing machine 10 to perform a fluid dispensing operation. The fluid dispensing operation may be executed by the system controller 16 issuing one or more signals or commands to the applicator 26 and X-Y-Z axis-drives 48. In response to these signals or commands, the valve member 64 may be cycled and the applicator 26 moved relative to the substrate so that fluid is dispensed on the substrate in a desired area.

In response to completion of the dispensing operation, the system controller 16 may proceed to block 120. In block 120, the system controller 16 increments the nozzle operation cycle register, which may reside in the system controller memory 38, by adding the cycles performed in the dispensing operation to the preexisting number of cycles. The system controller 16 may thereby track the cumulative number of operation cycles to which the nozzle 52 has been subjected.

In block 122, the system controller 16 determines if the production mode has completed. For example, the production mode may be completed when the fluid dispensing machine 10 has finished processing of one or more substrates or a batch of substrates. In response to the production mode not being completed ("NO" branch of decision block 122), the system controller 16 may return to block 116 where the controller 16 compares the number of operation cycles indicated by the value stored in the nozzle operation cycle register to the lifetime number of cycles allowed by the production mode. The system controller 16 may thereby monitor the number of operation cycles on the nozzle 52 during operation of the fluid dispensing machine 10 so that the dispensing operation may be stopped in response to the nozzle 52 reaching the end of the nozzles' service life. In response to completion of the production mode ("YES" branch of decision block 122), the system controller 16 proceeds to block 124 and exits the production mode before proceeding to block 126.

In block 126, and in response to exiting the production mode, the system controller 16 may position the applicator 26 at the communication station 34. In response to the applicator 26 being positioned at the communication station 34, the system controller 16 transmits a query signal 90 containing data relating to dispensing operations conducted during the just completed production mode. This data may include an updated cumulative total number of cycles that the valve has performed, as well as information on one or more fluids dispensed by the nozzle 52 while the fluid dispensing machine 10 was in the production mode. In response to receiving the query signal 90, the communication device 60 may update data stored in the memory 86 of communication device 60 so that the data is available for later use. In an alternative embodiment of the invention, the system controller 16 may transmit the query signal 90 in response to exiting the production mode without first positioning the applicator 26 in the communication station 34. As discussed previously, this alternative embodiment may be use if, for example, the interrogation device 24 is an RFID tag reader that transmits a query signal having sufficient power to activate the communication device 60 without the communication device 60 being in close proximity to the interrogation device 24.

An operational history of the nozzle 52 may thereby be maintained in the memory 86 of the communication device 60. This data may used to adjust or control operation of fluid dispensing machines 10 to which the nozzle 52 has been coupled, such as described with respect to FIG. 4. The operational history data may also be downloaded to a consumable parts system or process improvement database maintained by the system operator. Using the data stored in the communication device 60, these systems may associate processed substrates with specific dispensing operations or program modes performed by specific fluid dispensing machines 10, applicators 26, or nozzles 52. Embodiments of the invention may thereby facilitate correlating production yield issues to a particular fluid dispensing machine 10, applicator 26, nozzle 52, or process. In addition, more accurate models for predicting nozzle lifetime based on number of operation cycles or types of fluids dispensed may be developed by correlating operational nozzle histories to actual nozzle performance. More accurate tracking of remaining nozzle lifetimes may also allow better inventory management by providing system operators with more accurate forecasts of the demand for replacement nozzles.

References herein to terms such as "vertical", "horizontal", "upper", "lower", "raise", "lower", etc. are made by way of example, and not by way of limitation, to establish a frame of reference. It is understood by persons of ordinary skill in the art that various other frames of reference may be equivalently employed for purposes of describing the embodiments of the invention.

It will be understood that when an element is described as being "attached", "connected", or "coupled" to or with another element, it can be directly connected or coupled to the other element or, instead, one or more intervening elements may be present. In contrast, when an element is described as being "directly attached", "directly connected", or "directly coupled" to another element, there are no intervening elements present. When an element is described as being "indirectly attached", "indirectly connected", or "indirectly coupled" to another element, there is at least one intervening element present.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" or "comprising," when used in this specification, specify the presence of stated features, integers, steps, operations, elements, or components, but do not preclude the presence or addition of one or more other features, integers, steps, operations, elements, components, or groups thereof. Furthermore, to the extent that the terms "includes", "having", "has", "with", "composed of", or variants thereof are used in either the detailed description or the claims, such terms are intended to be inclusive in a manner similar to the open-ended term "comprising."

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An apparatus, comprising:
   a nozzle configured to be removably coupled to a body of an applicator and to receive fluid therefrom, the nozzle comprising a valve seat and an outlet in fluid communication with an inlet defined by the valve seat, wherein the valve seat is configured to be contacted by a valve member of the applicator, when the nozzle is coupled to the body, so as to urge fluid through the inlet to dispense amounts of the fluid by jetting the fluid from the outlet and onto a substrate; and
   a communication device configured to be coupled to the applicator and including a memory, the communication device configured to transmit information that resides in the memory and that relates to the applicator to an interrogation device in response to receiving a query signal from the interrogation device,
   wherein the applicator comprises a fluid material dispensing applicator, and
   wherein the information comprises a size of an opening in the valve seat.

2. The apparatus of claim 1, wherein the information relates to (i) operational history data of the applicator, (ii) configuration data of the applicator, or (iii) both the operational history data and the configuration data of the applicator; and wherein the applicator is configured for implementation in a fluid dispensing machine.

3. The apparatus of claim 1, wherein the information comprises at least one of (i) a cumulative number of operation cycles to which the valve seat has been subjected, (ii) an identity of the applicator to which the nozzle has been removably coupled, (iii) a type of fluid that has been dispensed by the nozzle, (iv) a type of material of which the valve seat is comprised, or (v) an identity of the nozzle.

4. The apparatus of claim 1, wherein the communication device is a radio frequency identification (RFID) tag including a transceiver coupled to the memory and configured to transmit the information as a wireless response signal in response to receiving the query signal from the interrogation device; and wherein the query signal is a wireless query signal.

5. The apparatus of claim 1, wherein the nozzle includes an exterior surface having a recess, and the communication device is located in the recess; and wherein the applicator is configured for implementation in a fluid dispensing machine.

6. The apparatus of claim 1, wherein the nozzle is configured to jet the amounts of fluid from the nozzle; and wherein the applicator is configured for implementation in a fluid dispensing machine.

7. An applicator, comprising:
   the apparatus of claim 1;
   the body of the applicator; and
   the valve member disposed in the body, wherein the valve member is configured to move reciprocally within a channel in the body so as to contact the valve seat to dispense amounts of the fluid by jetting the fluid from the outlet onto the substrate; and wherein the applicator is configured for implementation in a fluid dispensing machine.

8. A system, comprising:
   the applicator of claim 7; and
   an interrogation device configured to transmit the query signal to the communication device.

9. The system of claim 8, further comprising:
   multi-axis drive coupled to the applicator and configured to move the applicator; and
   a system controller coupled to the interrogation device and the multi-axis drive, the system controller being configured to cause the multi-axis drive to position the applicator so that the communication device of the nozzle moves in close proximity to the interrogation device when the interrogation device is transmitting the query signal.

10. The system of claim 8, comprising a system controller coupled to the interrogation device, the system controller configured to cause the applicator to perform a fluid dispensing operation and to determine if the nozzle is compatible with the fluid dispensing operation based on data contained in a response signal.

11. The system of claim 10, wherein the system controller is configured to interrupt the fluid dispensing operation in response to determining that the nozzle is not compatible with the fluid dispensing operation.

12. The system of claim 10, wherein data contained in the memory includes data relating to a fluid previously dispensed by the nozzle, and the system controller is configured to determine if the nozzle is compatible with the fluid dispensing operation by determining if the fluid previously dispensed by the nozzle is compatible with the fluid dispensing operation.

13. A method, comprising:
receiving, from an interrogation device, a query signal in a communication device coupled to an applicator, the applicator comprising a body, a valve member, and a nozzle coupled to the body, the nozzle having a valve seat and an outlet in fluid communication with an inlet defined by the valve seat, wherein the valve member is configured to move reciprocally within a channel of the body into contact with the valve seat to urge fluid through the inlet to dispense amounts of the fluid by jetting the fluid from the outlet and onto a substrate; and
transmitting, in response to receiving the query signal, information from the communication device to the interrogation device, wherein the information resides in a memory of the communication device and relates to the applicator,
wherein the applicator comprises a fluid material dispensing system, and
wherein the information comprises a size of an opening in the valve seat.

14. The method of claim 13, wherein the information relates to (i) operational history data of the applicator, (ii) configuration data of the applicator, or (iii) both the operational history data and the configuration data of the applicator; and wherein the applicator is configured for implementation in a fluid dispensing machine.

15. The method of claim 13, wherein the information comprises at least one of (i) a cumulative number of operation cycles to which the valve seat has been subjected, (ii) an identity of the applicator to which the nozzle has been removably coupled, (iii) a type of fluid that has been dispensed by the nozzle, (iv) a type of material of which the valve seat is comprised, or (v) an identity of the nozzle; and wherein the applicator is configured for implementation in a fluid dispensing machine.

16. The method of claim 13, wherein the communication device is a radio frequency identification (RFID) tag including a transceiver coupled to the memory and configured to transmit a wireless response signal in response to receiving the query signal as a wireless query signal; and wherein the applicator is configured for implementation in a fluid dispensing machine.

17. The method of claim 13, further comprising:
moving the valve member reciprocally within the channel of the body into contact with the valve seat, thereby urging the fluid through the inlet to dispense amounts of the fluid by jetting the fluid from the outlet and onto the substrate.

18. An apparatus, comprising:
a nozzle configured to be removably coupled to a body of an applicator and to receive fluid therefrom, the nozzle comprising a valve seat and an outlet in fluid communication with an inlet defined by the valve seat, wherein the valve seat is configured to be contacted by a valve member of the applicator, when the nozzle is coupled to the body, so as to urge fluid through the inlet to dispense amounts of the fluid by jetting the fluid from the outlet and onto a substrate; and
a communication device configured to be coupled to the applicator and including a memory, the communication device configured to transmit information that resides in the memory and that relates to the applicator to an interrogation device in response to receiving a query signal from the interrogation device,
wherein the applicator comprises a fluid material dispensing applicator, and
wherein
1) the information comprises a size of an opening in the valve seat,
2) the information comprises a type of material comprising the valve seat, or
3) the information comprises a cumulative number of operation cycles to which the valve seat has been subjected, and the apparatus comprises a controller that is configured to alert an operator that a projected lifetime of the nozzle has been reached based on the cumulative number of operation cycles of the information.

19. The apparatus of claim 18, wherein the information comprises the type of material comprising the valve seat.

20. The apparatus of claim 18, wherein the information comprises the cumulative number of operation cycles to which the valve seat has been subjected, and the apparatus comprises the controller that is configured to alert the operator that the projected lifetime of the nozzle has been reached based on the cumulative number of operation cycles of the information.

* * * * *